(12) United States Patent
Xiong

(10) Patent No.: US 9,191,060 B2
(45) Date of Patent: Nov. 17, 2015

(54) DISTRIBUTIVE SOURCE CODING AND SIGNAL PROCESSING

(71) Applicant: The Hong Kong University of Science and Technology, Kowloon, Hong Kong (CN)

(72) Inventor: Maosheng Xiong, Hong Kong (CN)

(73) Assignee: THE HONG KONG UNIVERSITY OF SCIENCE AND TECHNOLOGY, Kowloon (HK)

( * ) Notice: Subject to any disclaimer, the term of this patent is extended or adjusted under 35 U.S.C. 154(b) by 0 days.

(21) Appl. No.: 14/394,718

(22) PCT Filed: Apr. 16, 2013

(86) PCT No.: PCT/CN2013/000441
§ 371 (c)(1),
(2) Date: Oct. 15, 2014

(87) PCT Pub. No.: WO2013/155875
PCT Pub. Date: Oct. 24, 2013

(65) Prior Publication Data
US 2015/0055688 A1 Feb. 26, 2015

Related U.S. Application Data

(60) Provisional application No. 61/686,955, filed on Apr. 16, 2012.

(51) Int. Cl.
*H04B 1/00* (2006.01)
*H04B 1/707* (2011.01)
(Continued)

(52) U.S. Cl.
CPC ............. *H04B 1/707* (2013.01); *H03M 7/3084* (2013.01); *H04B 1/16* (2013.01)

(58) Field of Classification Search
CPC ............ H04B 1/707; H04B 1/16; H04B 1/69; H04B 2201/709709; H04L 2025/03414; H04L 1/0014; H03M 7/3084
USPC .................... 375/260, 130, 285, 346, E1.002; 714/783, 786, 492, E11.001, E11.023
See application file for complete search history.

(56) References Cited

U.S. PATENT DOCUMENTS 5,942,005 A * 8/1999 Hassner et al. ............... 714/784
7,243,292 B1 7/2007 Naslund et al.
(Continued)

FOREIGN PATENT DOCUMENTS

WO 2008084482 A2 7/2008
WO 2011098488 A1 8/2011

OTHER PUBLICATIONS

Li, W.C. Winnie. "Number Theory With Applications", Series on University Mathematics, vol. 7, World Scientific Publishing Co. Pte. Ltd., 1996. 241 pages.
(Continued)

*Primary Examiner* — Rahel Guarino
(74) *Attorney, Agent, or Firm* — Amin, Turocy & Watson, LLP

(57) ABSTRACT

Signal processing, data encoding and/or decoding techniques are applied in a dictionary system. A dictionary is generated as a function of time shift and phase shift distortion. Atoms of the dictionary can be determined. Further, parameters of the dictionary can be flexibly chosen. In one aspect, signals can be processed as a function of the dictionary.

27 Claims, 10 Drawing Sheets

(51) Int. Cl.
    *H03M 7/30*      (2006.01)
    *H04B 1/16*      (2006.01)

(56)           References Cited

U.S. PATENT DOCUMENTS

| 8,108,438 | B2* | 1/2012 | Hadani | 707/802 |
|---|---|---|---|---|
| 2005/0063458 | A1* | 3/2005 | Miyake et al. | 375/235 |
| 2005/0138533 | A1* | 6/2005 | Le Bars et al. | 714/784 |
| 2005/0257115 | A1* | 11/2005 | Piret et al. | 714/752 |
| 2009/0204627 | A1 | 8/2009 | Hadani | |
| 2012/0151300 | A1* | 6/2012 | Tillema | 714/768 |

OTHER PUBLICATIONS

International Search Report for International Application No. PCT/CN2013/000441, dated Aug. 1, 2013, 2 pages.
Daubechies, et al. "Painless non-orthogonal expansions", J. Math. Phys. 27 (5), 1271-1283, 1986.
Ding, et al. "Bounds on and constructions of unit time-phase signal sets", Dec. 2, 2011, published online at [http://arxiv.org/abs/1112.0383], retrieved on Jan. 13, 2015, 12 pages.
Golomb, et al. "Signal Design for Good Correlation for Wireless Communication, Cryptography, and Radar", Cambridge, U.K.: Cambridge Univ. Press, 2005.
Gurevich, et al. "The finite harmonic oscillator and its applications to sequences, communication and radar", IEEE Transactions on Information Theory, Vol. 54, No. 9, Sep. 2008, pp. 4239-4253.
Gurevich, et al. "Group representation design of digital signals and sequences", in Sequences and Their Applications—SETA 2008: 5th International Conference Lexington, KY, USA, Sep. 14-18, 2008, vol. 5203, Lecture Notes in Computer Science, pp. 153-166.
Gurevich, et al. "The finite harmonic oscillator and its associated sequences", Proceedings of the National Academy of Sciences of the United States of America, Jul. 22, 2008, vol. 105, No. 29, pp. 9869-9873.
Howard, et al. "The finite Heisenberg-Weyl groups in radar and communications", EURASIP Journal on Applied Signal Processing, vol. 2006, Article ID 85685, 2006, pp. 1-12.
Kim, et al. "A New Family of p-Ary Sequences of Period (pn—1)/2 With Low Correlation", IEEE Transactions on Information Theory, vol. 57, No. 6, Jun. 2011, pp. 3825-3830.
Welch. "Lower bounds on the maximum cross correlation of signals", IEEE Transactions on Information Theory, vol. IT-20, No. 3, pp. 397-399, May 1974.
Paterson, et al. "On the existence and construction of good codes with low peak-to-average power ratios", IEEE Transactions on Information Theory, vol. 46, No. 6, Sep. 2000, pp. 1974-1987.
Proakis, et al. "Digital Communications", 5th ed., New York: McGraw-Hill, 2007, 1170 pages.
Sampath. "Multi-channel jamming attacks using cognitive radios", Proc. IEEE 16th International Conference on Computer Communications and Networks, pp. 352-357, Aug. 2007.
Wang, et al. "New sequences design from Weil representation with low two-dimensional correlation in both time and phase shifts", IEEE Transactions on Information Theory, vol. 57, No. 7, Jul. 2011, pp. 4600-4611.
Tropp. "Just Relax: Convex Programming Methods for Identifying Sparse Signals in Noise", IEEE Transactions on Information Theory, vol. 52, No. 3, Mar. 2006, pp. 1030-1051.
Weil. "On some exponential sums", Proceedings of the National Academy of Sciences of the United States of America, vol. 34, No. 5, pp. 204-207, May 15, 1948.

* cited by examiner

DISTRIBUTIVE SOURCE CODING AND SIGNAL PROCESSING

CROSS-REFERENCE TO RELATED APPLICATIONS

This application is a United States National Phase application of, and claims priority to each of, PCT Application Number PCT/CN2013/000441, filed on Apr. 16, 2013, and entitled "DISTRIBUTIVE SOURCE CODING AND SIGNAL PROCESSING", which claims priority to U.S. Provisional Application No. 61/686,955 filed Apr. 16, 2012, and entitled "A NOVEL CONSTRUCTION OF TIME-PHASE DICTIONARIES", the entireties of which applications are hereby expressly incorporated herein by reference.

TECHNICAL FIELD

This disclosure generally relates to distributive source coding and compressed sensing methods and systems.

BACKGROUND

Wireless communication systems are ubiquitous for personal and commercial uses. Demand for such systems continues to increase as the quantity of users, devices, and data increases. However there is a limit to the number of signals a communication system can accommodate per the number of orthogonal or quasi-orthogonal codes, for a direct sequence spread spectrum application. This is because the communication system is an interference limited and/or a code limited resource.

Data signals, or simply signals, are sequences of finite length repeating periodically. A signal of length n, can be represented as a vector in an n-dimensional space of complex number or equivalently as a complex-valued function.

In direct-sequence spread spectrum (DSSS) communication systems, multiple signals with different encoding sequences are transmitted simultaneously. To retrieve the desired data stream from the overall data signal, the specific code sequence used to encode the desired signal is reproduced at a receiver, and via the autocorrelation properties, used to detect the original data stream from the noise of and interference in the overall signal.

In a code division multiple access (CDMA) communication systems, a multiple access technique in which a plurality of substantially orthogonal codes are used to spread spectrum modulate user signals within a system. Each modulated user signal may have an overlapping frequency spectrum with other modulated user signals in the system. However, because the underlying modulation codes are orthogonal, it is possible to demodulate individual user signals by performing a correlation operation using the appropriate code. As can be appreciated, a communication device operating within a CDMA-based system will often receive overlapping communication signals associated with a variety of different users. The signals associated with other users will typically appear as interference when trying to demodulate a signal associated with a desired user within the communication device.

The above-described background is merely intended to provide an overview of information regarding wireless communication networks, and is not intended to be exhaustive. Additional context may become apparent upon review of one or more of the various non-limiting embodiments of the following detailed description.

BRIEF DESCRIPTION OF THE DRAWINGS

Various non-limiting embodiments are further described with reference to the accompanying drawings in which.

DETAILED DESCRIPTION

Figure 1:
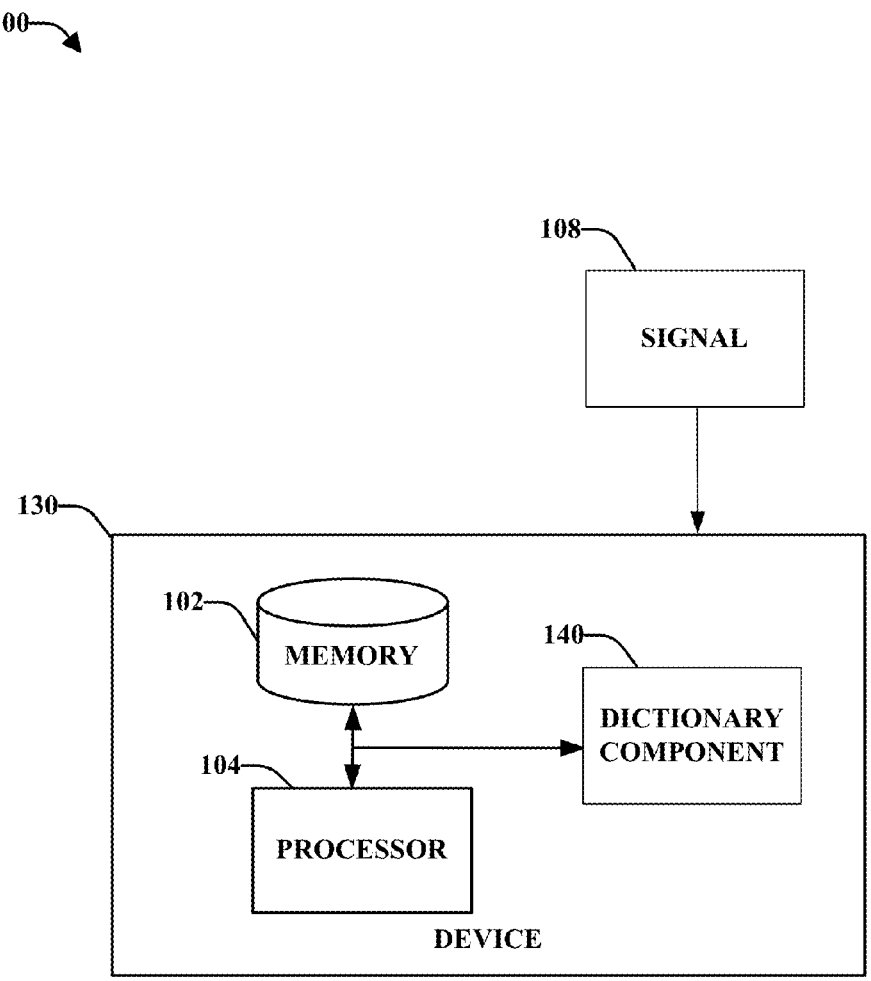
FIG. 1 illustrates a high level functional block diagram of a system for generation of a dictionary and signal processing in accordance with various embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Various aspects disclosed herein relate to construction of a dictionary for coding and decoding signals. In an aspect, a communication system, such as a CDMA or an orthogonal frequency-division multiple access (OFMA) communication system can utilize the dictionary. A dictionary refers to a set of unit signals, referred to herein as D, unless context suggests otherwise. In an aspect, each non-zero signal can be normalized into a unit signal. Each element (e.g., vector) of the dictionary is referred to as an atom, represented herein as $\phi$, unless context suggests otherwise. In general, a system can determine a sparse representation, wherein sparse referrers to having relatively few non-zero coefficient (e.g., a threshold level of non-zero coefficients). It is noted that and Z are both considered the same symbol, as used herein. Likewise, double-struck letters for H and D, are represented as H and D, herein.

As mentioned above, signals are sequences of finite length, n, as used herein, which repeat periodically, wherein n is a number. Signals can be referred to as vectors in dimensional space (e.g., n-dimensional space) of complex numbers or as complex-valued functions (e.g., defined on a set $Z_n=\{0, 1, \ldots, n-1\}$) given by mapping $\phi \mapsto (\phi(0), \phi(1), \ldots, \phi(n-1))$.

The space of signals can be represented as a Hilbert space (e.g., $H_n=H(Z_n)$), equipped with an inner product:

$$\langle \phi, \psi \rangle = \sum_{t \in Z_n} \phi(t)\overline{\psi(t)}, \forall \, \phi, \psi \in H_n,$$

where, t represents time and ψ can be a signal (e.g., which can be thought of as a vector).

In the above, the norm is $\|\phi\| = \sqrt{\langle \phi, \phi \rangle}$. In another aspect, if $\|\phi\| = 1$, then φ can be considered a unit signal. A subset D of $H_n$ ($D \subset H_n$) is called a unit signal set if D consists of only unit signals.

Given that a (non-zero) signal can be normalized into a unit signal, it is enough to consider unit signal sets. Accordingly, $D \subset H_n$ can be a unit signal set. CDMA communication systems require that atoms are weakly correlated. That is, for every $\phi \neq \psi \in D$, the following holds:

$$|\langle \phi, \psi \rangle| \ll 1, \quad (1)$$

assuming that:

$$\frac{1}{R} = \max\{|\langle \phi, \psi \rangle| : \phi \neq \psi \in D\}, 1,$$

CDMA requires that each user is assigned an atom (e.g., φ∈D), for a spreading sequence for transmission. In an example, a user can be a device comprising a transmitter, for example.

Further, during a given time, corresponding to each atom φ of a subset $D' \subset D$ with a set cardinality $\#D' \leq N$, a user (e.g., user device) transmits a bit of information $b_\phi$ (wherein $b_\phi$ is taken to be a root of unity), by sending a transmission (referred to herein as $b_\phi \phi$), to an antenna, for example.

In an aspect, the transmission $b_\phi \phi$ is sent through a shared channel, and the antenna receives a signal of the transmission u (such as from a device), e.g.:

$$u = \sum_{\phi \in D'} b_\phi \phi. \quad (2)$$

In an aspect, the equation (2) can be called a sparse presentation of the signal u. In an aspect, equation (2) can be considered the sparsest possible representation of the signal u.

In an implementation, a system can extract individual bits $b_\phi$ from the signal u, by computing the inner product as $$\langle \psi, u \rangle = \sum_{\phi \in D'} \langle \psi, u \rangle = \sum_{\phi \in D'} b_\phi \langle \psi, \phi \rangle = b_\psi 1_{D'}(\psi) + \sum_{\phi \in D' - \{\psi\}} \langle \psi, \phi \rangle,$$

Where $1_{D'}(\psi) = 1$ when ψ∈D' is true and $1_{D'}(\psi) = 0$ when ψ∈D' is not true. It is noted that:

$$\left| \sum_{\phi \in D' - \{\psi\}} \langle \psi, \phi \rangle \right| \leq \frac{N}{R}.$$

Intuitively, if, for example, $N \leq R/3$, the maximal value of $|\langle \psi, u \rangle|$ for all ψ∈D is achieved if and only if ψ∈D'. This could help identify each user ψ∈D', and for each such ψ, the value $\langle \psi, u \rangle$ is the bit $b_\psi$, plus an additional noise whose magnitude can be bounded, for example, by a constant such as ⅓.

Accordingly, $b_\phi$ can be recovered effectively by using algorithms in linear programming such as minimization and optimization routines.

In another aspect, the property (1) can fail, for example, as signals are distorted during transmissions. In various implementations, presented herein, systems and methods can account for distortion and/or determine distortion. In an aspect, a signal can experience time shift (τ) and/or phase shift (ω) distortion. Generally, time shift distortion occurs in asynchronous communication and phase shift distortion can occur as a relative velocity between a transmitting antenna and a receiving antenna alters (e.g., Doppler Effect). As used herein, time shift τ corresponds to the distance of the target from radar, and a phase shift ω corresponds to the velocity of a target.

As an example, time shift distortion can be represented as $\phi(t) \mapsto L_\tau \phi(t) = \phi(t+\tau)$ and phase shift distortion can be represented as $$\phi(t) \mapsto M_\omega \phi(t) = e^{\frac{2\pi i}{n} \omega t} \phi(t),$$

where $\tau, \omega \in Z_n$. Accordingly, general distortion can be of a type $M_\omega L_\tau \phi$. Thus, system and methods can determine, for any $\phi \neq \psi \in D$ or $(\tau, \omega) \neq (0,0) \in Z_n^2$, whether the below condition (anti-distortion condition) holds:

$$|\langle \phi, M_\omega L_\tau \psi \rangle| \ll 1 \quad (3)$$

In an aspect, condition (3) can determine whether the absolute value of the inner product of ψ and $M_\omega L_\tau \psi$ is at least a threshold less than 1. In an aspect, the threshold can be predetermined and/or dynamically determined.

In an example, a radar can send a signal φ(t) and obtain an echo e(t), wherein the echo is a reflection off an object (e.g., a target). The signal and echo can be associated with a transformation given as $$e(t) = e^{2\pi i \frac{\omega t}{n}} \phi(t+\tau) = M_\omega L_\tau \phi(t).$$

Accordingly, systems and methods can determine if condition (3) is satisfied and can perform optimizations to determine the distortion, location, and/or velocity of the target.

In another aspect, anti-distortion capability of a dictionary D with respect to time and phase shift can be measured from the following:

$$\lambda_D = \text{Max}\{|\langle \phi M_\omega L_\tau \psi \rangle| : \forall \phi \neq \psi \in D \text{ or } \forall (\tau, \omega) \neq (0,0)\}.$$

In an aspect, D can be considered an (n, M, λ) time-phase disctionary when it is determined that the unit signal set D has cardinality M and $\lambda_D \leq \lambda$. In another aspect, D can be considered an ambiguity signal set defined when λ<1.

In an implementation, atoms of a dictionary can be determined based on one or more thresholds. In an aspect, atoms can be determined based on a low peak-to-average power ratio. As an example, for every atom φ∈D, the following is satisfied:

$$\max\{|\phi(t)| : t \in Z_n\} 1. \quad (4)$$

In various aspects, atoms can be determined such that all aforementioned conditions hold when every atom φ∈D is replaced by their Fourier transform (e.g., Fourier invariance). In an aspect, the Fourier transform can be represented as F[φ], herein.

In another aspect, various implementations can generate a dictionary with an alphabet size that is relatively small compared to other systems and/or the alphabet size is a threshold alphabet size. For example, atoms can be generated such that for any atom $\phi \in D$ and any $0 \leq t \leq n-1$, a value $\sqrt{n}\phi(t)$ is the p-th root unity, such that the alphabet size is p.

Various systems and methods disclosed here related to generation of dictionaries of atoms. The dictionaries can be generated to have strong anti-distortion capacity with respect to time shift and phase shift, low peak-to average power ratio, Fourier invariance, and can be efficiently implemented. Additionally, the various systems and methods disclosed herein can relate to digital communication utilizing dictionaries, such as CDMA transmissions, radar networks, and transmission systems in cognitive radio networks, for example. It is noted that the generation and implementation of the various systems and methods can be employed in applications not explicitly discussed herein for purpose of brevity.

Referring now to the drawings, with reference initially to FIG. 1, presented is a system 100 that can facilitate generation of a dictionary and signal processing. Aspects of the systems, apparatuses or processes explained herein can constitute machine-executable component embodied within machine(s), e.g., embodied in one or more computer readable mediums (or media) associated with one or more machines. Such component, when executed by the one or more machines, e.g., computer(s), computing device(s), virtual machine(s), etc. can cause the machine(s) to perform the operations described. System 100 can include a device 130 that can comprise memory 102 for storing computer executable components and instructions. A processor 104 can facilitate operation of the computer executable components and instructions by the system 100. System 100 can further comprise a dictionary component 140 that can generate a dictionary. It is further noted that the system 100 can comprise one or more client devices, server devices, and/or network applications. Moreover, while components are depicted as separate components, it is noted that the components can be comprised in one or more devices, in a single device, across devices, and the like. The device 130 can be comprised in larger devices, such as personal computers, servers, laptop computers, tablet computers, smart phones, personal digital assistants, and the like. In another aspect, the device 130 can receive one or more signal 108.

The device 130 can generate a relatively large dictionary, denoted as D(n,s) herein. In an aspect, the dictionary component 140 can generate the dictionary D(n,s) as an $$\left(n, M_s, \frac{c_s}{\sqrt{n}}\right)$$

time-phase dictionary that has a relatively small alphabet size, and can be efficiently implemented. In an aspect, the dictionary component 140 can determine values of one or more parameters, such as n, s, $c_s$, and the like. In an aspect, the dictionary component 140 can determine n to be any factor of a prime power minus one, where n is a length of the dictionary D(n,s). In an aspect, the parameters can be selected based on a desired size of an alphabet (e.g., a threshold size). Further, the dictionary component 140 can determine s to be any positive integer subject to a threshold as a function of n. In an aspect, s can be a positive integer not to large with respect to n. In an example, s can be determined such that $c_s < \sqrt{n}$. In another aspect, the length of s can be determined to generate a target amount of atoms. For example, s can be determined (e.g., chosen) to generate a fairly large amount of atoms.

In another aspect, the dictionary component 140 can determine $c_s$ such that $c_s$ is a positive constant. In an aspect, $c_s$ can be determined such that the condition $c_s < 2s+1$ holds. In another aspect, the cardinality $M_s$ can be $n^2$ and/or near $n^2$. In an aspect, the device 130 can utilize the dictionary D(n,s) to facilitate interpreting a radar signal, denoising a signal, compressing data, deblurring signals, encoding signals for at least one of CDMA communication or orthogonal frequency-division multiplexing (OFDM) communication, classifying a data set, generating a random number, generating an error correcting code, and/or the like.

In another aspect, the dictionary component 140 can generate the dictionary D(n,s) based on various aspects disclosed herein. For example, the dictionary component 140 can generate $F_q$ as a function of a primitive element a (e.g., primitive root of unity), to be a finite field of cardinality q, where $q=p^r$ is a prime power. A trace map $Tr: F_q \to F_p$ can be a natural additive function given by $Tr(x)=x+x^2+x^{p^2}+\ldots+x^{p^{r-1}}$, $\forall x \in F_q$, where $F_p$ can be a finite field identified with a set $Z_p=\{0, 1, \ldots, p-1\}$. In an aspect, the dictionary component 140 can utilize the trace function Tr. It is noted that an additive $\psi$ function from $F_q$ to the set of p-th roots of unity can be given as:

$$\psi(x) = e^{2\pi\sqrt{-1}\frac{Tr(x)}{p}}, \forall x \in F_q. \quad (5)$$

In an implementation, the dictionary component 140 can set n as q−1. The dictionary component 140 can further set s as any fixed positive integer, and set γ to be a fixed power of α. The dictionary component 140 can generate a sequence of integers ($\{\lambda_i\}_{i=0}^s$) with respect to q, where $\lambda_0 < \lambda_1 < \ldots \lambda_s$. It is noted that $\lambda_i$ can be a negative or positive number. It is noted that the sequence $\{\lambda_i\}_{i=0}^s$ can be predetermined.

Further, the dictionary component 140 generate a set $I_s$ that comprises s-dimensional vectors of integers $\underline{j}=(j_1, j_2, \ldots, j_s)$ such that each component $j_i$ has an integer value inside an interval, where the interval is determined with respect to $\lambda_i$. It is noted that the cardinality of $I_s$ is or is about $n^2$. The dictionary component 140 can generate an atom $\phi_{\underline{j}}$ for each vector $\underline{j} \in I_s$. It is noted that as t runs over any complete residue system modulo n (e.g., $0 \leq t \leq n-1$), the t-th component of $\phi_{\underline{j}}$ is $\phi_{\underline{j}}(t)$ and $\phi_{\underline{j}}(t)$ is a function of the form $$\phi_{\underline{j}}(t) = \frac{1}{\sqrt{n}}\psi\left(\gamma^t + \sum_{i=1}^s \gamma^{\lambda_i(t+j_i)}\right).$$

It is noted that various additive functions other than $\psi(x)$ (e.g., equation 5) can be utilized. It is further noted that any fixed value can be utilized to alter $\phi_{\underline{j}}(t)$. For example, a set of fixed values $\alpha_i$ can be utilized, where i is the i-th element, such that $\alpha, \alpha_1, \ldots, \alpha_s \in F_q - \{0\}$, and choose $$\phi_{\underline{j}}(t) = \frac{1}{\sqrt{n}}\psi\left(\alpha\gamma^t + \sum_{i=1}^s \alpha_i\gamma^{\lambda_i(t+j_i)}\right).$$

Accordingly, the dictionary F(n,s) can be given as $F(n,s)=\{\phi_{\underline{j}}: \underline{j} \in I_s\}$.

As such, the dictionary component 140 can determine a representation of a finite index set that comprises at least one vector of integers having a defined positive integer number of dimensions. In another aspect, the dictionary component can generate a dictionary of a defined length comprising the first atom, wherein the defined length is determined as a factor of a prime number power minus one and a positive constant. In various implementations, the dictionary component 140 is further configured to determine the positive integer number of dimensions as a function of the defined length. In another aspect, the dictionary component 140 can select at least one of the positive integer number of dimensions, the defined length, and the positive constant as a function of a defined alphabet size of the dictionary. In another implementation, the dictionary component 140 can determine the positive constant as a function of the positive integer number of dimensions.

Figure 2:
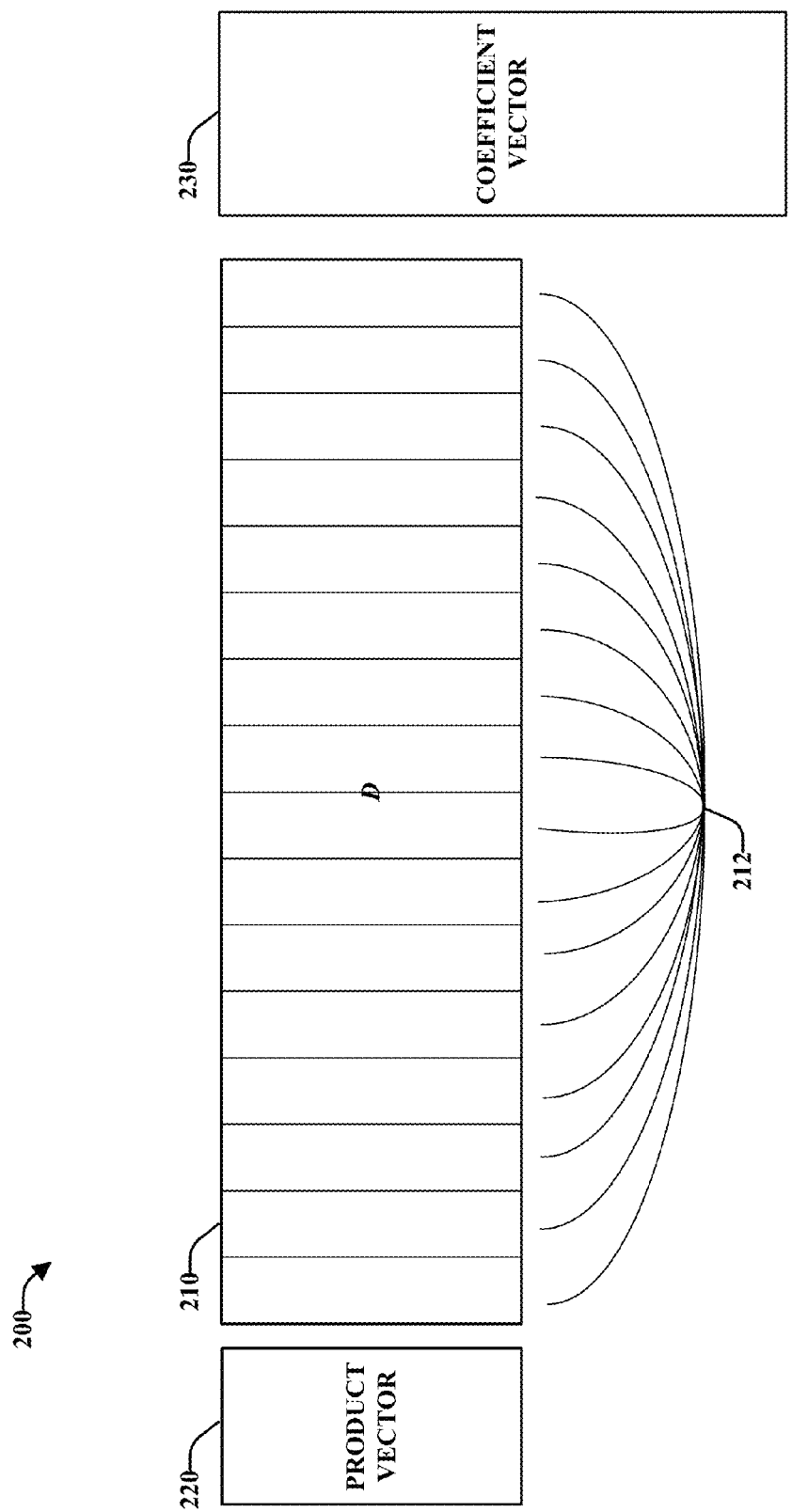
FIG. 2 illustrates a high level functional block diagram of a system for generation of a dictionary and signal processing including a dictionary, in accordance with various embodiments.

Turning to FIG. 2, presented is a dictionary system 200 that can facilitate generation of a dictionary and signal processing. In an aspect, various systems and methods disclosed herein can generate and/or utilize the dictionary system 200. The dictionary system 200 comprises a dictionary 210, a signal 220, and a vector of coefficients 230. The dictionary 210 can comprise a set of atoms 212. It is noted that the dictionary 210 is depicted as having 16 atoms, however the dictionary can comprise more or less atoms. In an aspect, the signal 220 can be generated as the product of the dictionary 210 and the vector of coefficients 230.

In an aspect, the signal 220 can be represented in more than one way (e.g., over completeness), thus, coefficients of the vector of coefficients 230 are not unique. In another aspect, the dictionary 210 can be generated as discussed with reference to FIG. 1.

Figure 3:
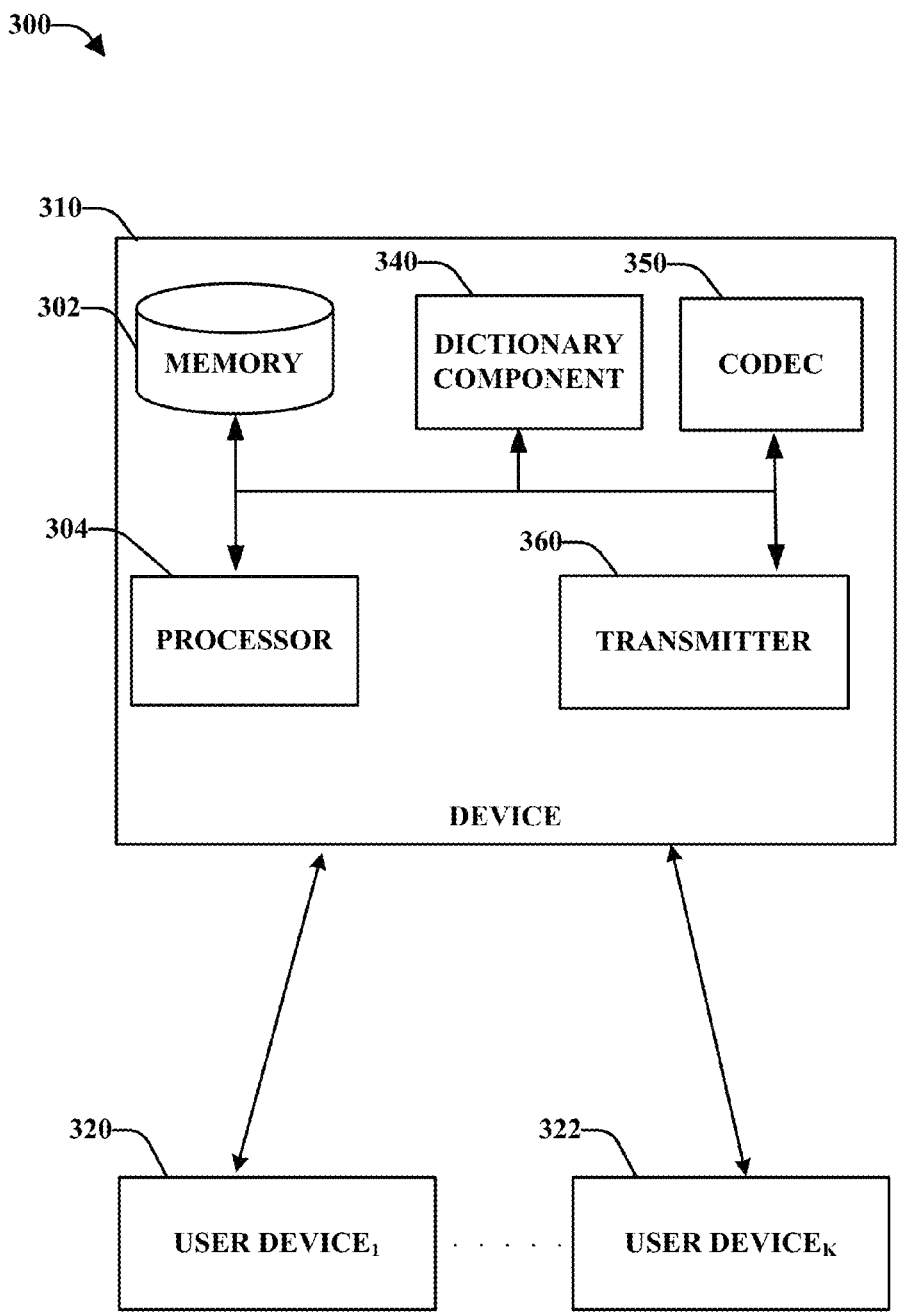
FIG. 3 illustrates a high level functional block diagram of a system for generation of a dictionary and signal processing including a codec and transmitter in accordance with various embodiments.

Referring now to FIG. 3, presented is a system 300 that can facilitate generation of a dictionary and signal processing. Aspects of the systems, apparatuses or processes explained herein can constitute machine-executable component embodied within machine(s), e.g., embodied in one or more computer readable mediums (or media) associated with one or more machines. Such component, when executed by the one or more machines, e.g., computer(s), computing device(s), virtual machine(s), etc. can cause the machine(s) to perform the operations described. System 300 can include a device 310 that can comprise memory 302 for storing computer executable components and instructions, a processor 304 can facilitate operation of the computer executable components and instructions by the system 300, a codec component 350, and a transmitter component 360. System 300 can further comprise a dictionary component 340 that can generate a dictionary, and one or more user devices in communication with the device 310 (e.g., user device$_1$ 320 through device$_k$ 322, where q is an integer). It is further noted that the system 300 can comprise one or more client devices, server devices, and/or network applications. Moreover, while components are depicted as separate components, it is noted that the components can be comprised in one or more devices, in a single device, across devices, and the like. The device 310 can be comprised in larger devices, such as personal computers, servers, laptop computers, tablet computers, smart phones, personal digital assistants, and the like. In an aspect, the dictionary component 340 can generate a dictionary (similar to dictionary component 140).

In an implementation, the device 130 can communicate with one or more user devices (e.g., user device$_1$ 320 through user device$_k$ 322), where k is a number. While aspects of this disclosure refer to a user device (e.g., of the user device$_1$) it is noted that any user device of the user device$_1$ 320 through user device$_k$ 322 can be utilized. The user device$_1$ 320 can send and/or receive signals (e.g., through a network, such as a cellular network). In an aspect, the device 130 can receive and interpret signals sent from the user device$_1$ 320.

In implementations, user devices can utilize CDMA communication and the like. In past CDMA systems atoms or pseudo-random codes that do not guarantee orthogonality. Accordingly, a value transmitted by a user device can experience interference. The dictionary component 340 can apply various aspects of the dictionary (e.g., atoms of the dictionary) to processes, denoise, deblur, and/or encode/decode the signals.

In another aspect, the codec component 350 can utilize the dictionary to encode and/or decode signals. For example, the codec component 350 can generate a compressed signal through entropy encoding, for example. In an aspect, the codec component 350 can generate a dictionary based on the signals to be compressed. For example, the codec component 350 can determine correlation in a plurality of signals. The codec component 350 can encode each signal independently by projecting each signal onto another incoherent basis. Further, the transmitter 360 can transmit the encoded signal (e.g., to a signal processor of the user device$_1$ 320).

In another aspect, the codec component 360 can decode a plurality of correlated signals based upon determining a correlation of sparse representations of the signals (e.g., via a generated dictionary). In various aspects, the user device$_1$ 320 can comprise a codec component capable of decoding the plurality of correlated signals and/or encoding signals to be sent to another device (e.g., the device 310).

According to one or more implementations, the transmitter 360 can generate signals to send to one or more device (e.g., user device$_1$ 320). It is noted that the transmitter 360 can comprise one or more transmitter, such as an array of transmitters. In an aspect, each transmitter can be assigned an atom of a generated dictionary. In an another aspect, each transmitter can utilize the codec component 350 to encode signals (e.g., messages) by modulation onto the atom (e.g., multiplying a value of an atom at each time by the value of the message to generate a vector).

In another aspect, each user device$_1$ 320 through user device$_k$ 322 can be assigned an atom of a generated dictionary. In an aspect, the atom can be a spreading sequence for transmission. In an example, the user device$_1$ 320 can send a transmission as a sequence of bits. In an aspect, at a given time corresponding to each atom of a subset $D' \subset D$, the user can transmit a bit taken as a root of unity. In an aspect, the dictionary component 340 can generate a sparse representation of the signal (e.g., equation 2). In another aspect, the dictionary component can extract individual bits from the transmission, for example by computing the inner product, as disclosed herein.

Figure 4:
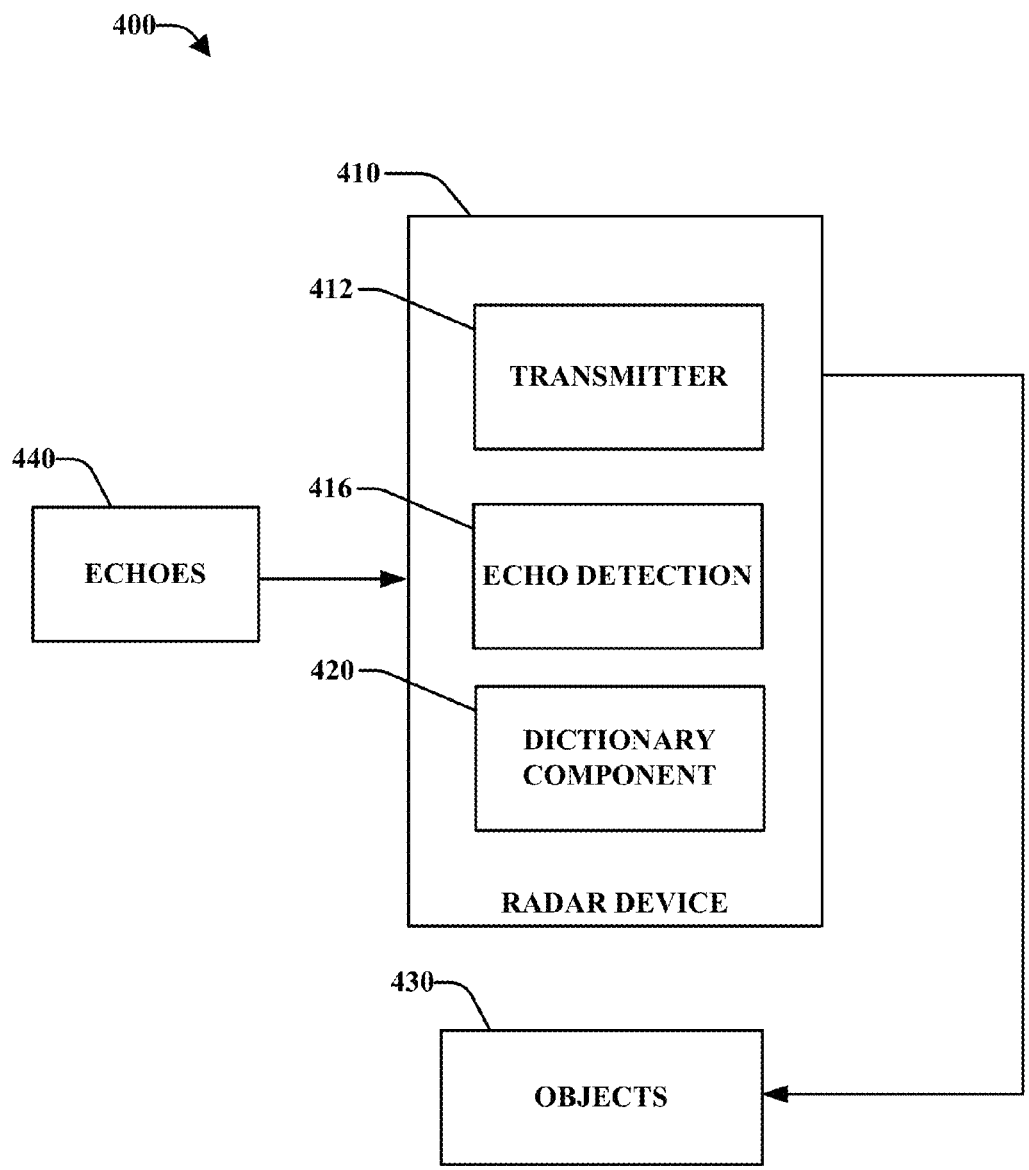
FIG. 4 illustrates a high level functional block diagram of a system for generation of a dictionary and signal processing including an echo detection component and a transmitter in accordance with various embodiments.

Referring now to FIG. 4, presented is a system 400 that can facilitate generation of a dictionary and interpretation of radar signals. In an aspect, the system 400 can generate a dictionary of atoms, wherein the dictionary can have a relatively large length, strong anti-distortion properties, a relatively small alphabet, and a low peak to average power ration.

Included in system 400 is a radar device 410, which can be any one of a number of devices including, but not limited to, a base station, a network device, a mobile device, and so forth. The radar device 410 can comprise at least one memory that can store computer executable components and instructions, and at least one processor communicatively coupled to at least one memory. Coupling can include various communications including, but not limited to, direct communications, indirect communications, wired communications, and/or wireless communications. The processor can facilitate execution of the computer executable components stored in the memory. The processor can be directly involved in the execution of the computer executable component(s), according to an aspect. Additionally or alternatively, the processor can be indirectly involved in the execution of the computer executable component(s). For example, the processor can direct one or more components to perform the operations. Further, the radar device 410 can comprise an echo detection component 416 and a transmitter 412.

In an aspect, the dictionary component 420 can generate a dictionary, such as a $$\left(n, M_s, \frac{c_s}{\sqrt{n}}\right)$$

time-phase shift dictionary, in accordance with various aspects of this disclosure. In an aspect, the dictionary component can store the generated dictionary in a memory, for example.

In an implementation, the transmitter 412 can generate signals to be transmitted. It is noted that the transmitter 412 can comprise one or more transmitters (e.g., a transmitter array). Further, the transmitter 412 can send a plurality of signals at various times, and at various conditions of transmission (e.g., angle, direction, etc.). In an aspect, the signals can bounce off (e.g., reflect off) an object(s) 430 (e.g., target (s)). As signals are reflected, they can be considered echoes. It is noted that object(s) 430 can comprise virtually any object and/or set of objects. As such, one or more signals can reflect off one or more objects 430. It is further noted that a single signal can reflect off multiple objects.

The echo detection component 416 can detect one or more echoes 440. In an aspect, the echo detection component 416 can receive and digitize (e.g., convert into computer readable data) the echoes 440. It is noted that a signal can experience time shift and/or phase shift distortion. As an example, signals can reflect from disparate objects 430, such that the signals reflect at different times, speeds, relative velocities and the like. In an aspect, the radar device 410 can utilize the generate dictionary to interpret and/or process the echoes 440.

In another aspect, the property (1) can fail, for example, as signals are distorted during transmissions. In various implementations, presented herein, systems and methods can account for distortion and/or determine distortion. In an aspect, a signal can experience time shift (τ) and/or phase shift (ω) distortion. Generally, time shift distortion occurs in asynchronous communication and phase shift distortion can occur as a relative velocity between a transmitting antenna and a receiving antenna alters (e.g., Doppler effect). As used herein, time shift τ corresponds to the distance of the target from the radar device 410, and a phase shift ω encodes the velocity of an object of the objects 430.

As an example, time shift distortion can be represented as $\phi(t) \mapsto L_\tau \phi(t) = \phi(t+\tau)$ and phase shift distortion can be represented as $$\phi(t) \mapsto M_\omega \phi(t) = e^{\frac{2\pi i}{n} \omega t} \phi(t),$$

where $\tau, \omega \in Z_n$. Accordingly, general distortion can be of a type $M_\omega L_\tau \phi$. Thus, system and methods can determine, for any $\phi \neq \psi \in D$ or $(\tau, \omega) \neq (0,0) \in Z_n^2$, whether the below condition holds:

$$|\langle \phi, M_\omega L_\tau \psi \rangle| \ll 1 \quad (6)$$

In an example, the transmitter 412 can send a signal φ(t) and obtain an echo 440 e(t), wherein the echo is a reflection off of one or more objects 430 (e.g., a target). The signal and echo can be associated with a transformation given as $$e(t) = e^{2\pi i \frac{\omega t}{n}} \phi(t+\tau) = M_\omega L_\tau \phi(t),$$

where the times shift τ corresponds to the distance of the target from the radar and the phase shift ω encodes the velocity of the target. Accordingly, systems and methods can determine if condition (3) is satisfied and can perform optimizations to determine the distortion, location, and/or velocity of the target.

In another aspect, anti-distortion capability of a dictionary D with respect to time and phase shift can be measured from the following:

$$\lambda_D = \text{Max}\{|\langle \phi, M_\omega L_\tau \psi \rangle| : \forall \phi \neq \psi \in D \text{ or } \forall (\tau, \omega) \neq (0,0)\}.$$

In an aspect, D(n,s) can be considered an (n, M, λ) time-phase disctionary when it is determined that the unit signal set D(n,s) has cardinality M and $\lambda_D \leq \lambda$. In another aspect, D(n,s) can be considered an ambiguity signal set defined when λ<1.

In an implementation, the dictionary component 420 can determine atoms of D(n,s) based on one or more thresholds. In an aspect, atoms can be determined based on a low peak-to-average power ratio. As an example, for every atom φ∈D, a Fourier transform (F[φ]), where j is a value of a j-th elements, can satisfy condition 4, as above.

In various aspects, atoms can be determined such that all aforementioned conditions hold when every atom φ∈D is replaced by their Fourier transform (e.g., Fourier invariance) F[φ].

In another aspect, various implementations can generate a dictionary with an alphabet size that is relatively small compared to other systems. For example, atoms can be generated such that for any atom φ∈D and any 0≤t≤n−1, a value $\sqrt{n}\phi(t)$ is the p-th root unity, such that the alphabet size is p.

In view of the example system(s) and apparatuses described above, example method(s) that can be implemented in accordance with the disclosed subject matter are further illustrated with reference to flowcharts of FIGS. 5-7. For purposes of simplicity of explanation, example methods disclosed herein are presented and described as a series of acts; however, it is noted that the claimed subject matter is not limited by the order of acts, as some acts may occur in different orders and/or concurrently with other acts from that shown and described herein. For example, one or more example methods disclosed herein could alternatively be represented as a series of interrelated states or events, such as in a state diagram. Moreover, interaction diagram(s) may represent methods in accordance with the disclosed subject matter when disparate entities enact disparate portions of the methodologies. Furthermore, not all illustrated acts may be required to implement a described example method in accordance with the subject specification. Further yet, two or more of the disclosed example methods can be implemented in combination with each other, to accomplish one or more features or advantages herein described.

Figure 5:
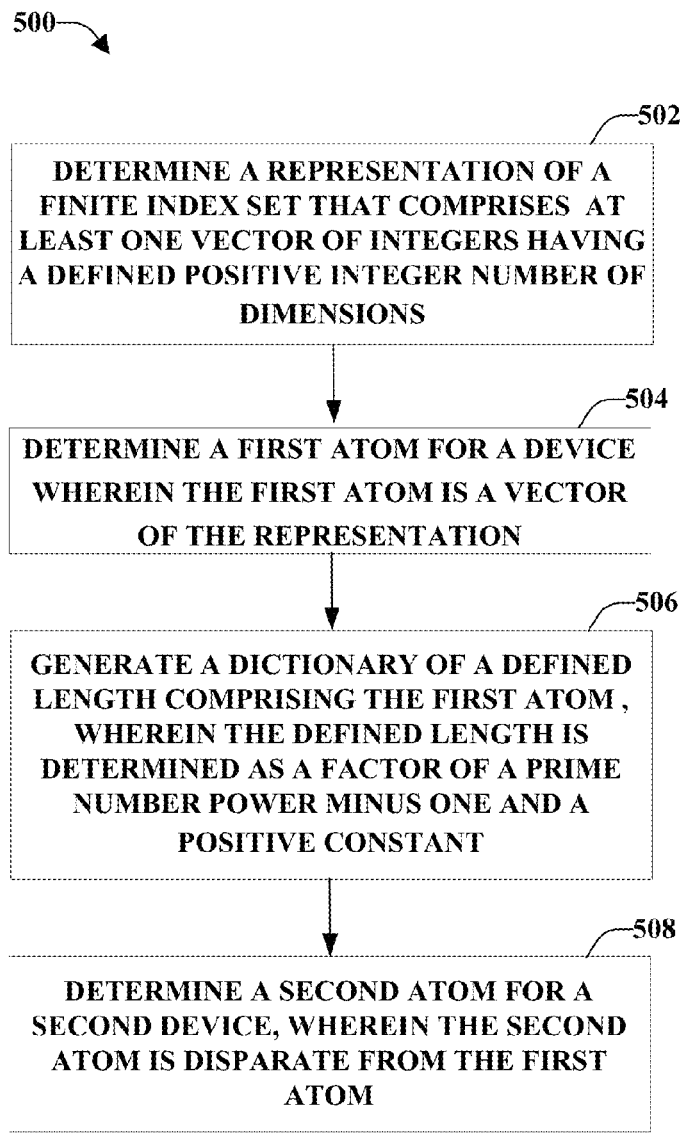
FIG. 5 illustrates a flow diagram of a method for generating a dictionary in accordance with an embodiment.

Turning to FIG. 5, with reference to FIGS. 1-4, there illustrated is an exemplary method 500 to generate a dictionary for signal processing. In an aspect, method 500 can generate the dictionary via one or more systems (e.g., system 100, 200, 300, 400, etc.). It is noted that efficiency(ies) of method 500 results from using various aspects of this disclosure.

At 502, a system can determine a representation of a finite index set that comprises at least one vector of integers having a defined positive integer number of dimensions. In as aspect, the defined positive integer number of dimensions can comprise s as disclosed above. For example, a system can generate a finite index set as described above.

At 504, a system can determine a first atom for a device wherein the first atom is a vector of the representation. In an aspect, an atom can be determined as described with reference to FIGS. 1-4. For example, a system can generate an atom φ and assign the atom to a specific device, user, and/or transmitter.

At 506, a system can a dictionary of a defined length comprising the first atom, wherein the defined length is determined as a factor of a prime number power minus one and a positive constant. In an implementation, a system can generate an $$\left(n, M_s, \frac{c_s}{\sqrt{n}}\right)$$

dictionary comprising the first atom, wherein n is a length of the dictionary and is a factor of a prime power minus one, s is a positive integer, and $c_s$ is an explicit positive constant. It is noted that the system can utilize various aspects disclosed herein to generate the dictionary. In another aspect, the dictionary can be generated as a function of alphabet size, a number of atoms, and the like.

At 508, a system can determine a second atom for a second device, wherein the second atom is disparate from the first atom. In accordance with various aspects of this disclosure, a system can generate atoms for specific devices. It is noted that the method 500 can be iterated a plurality of times. In another aspect, a system can add any number of atoms to the dictionary for any number of devices.

Figure 6:
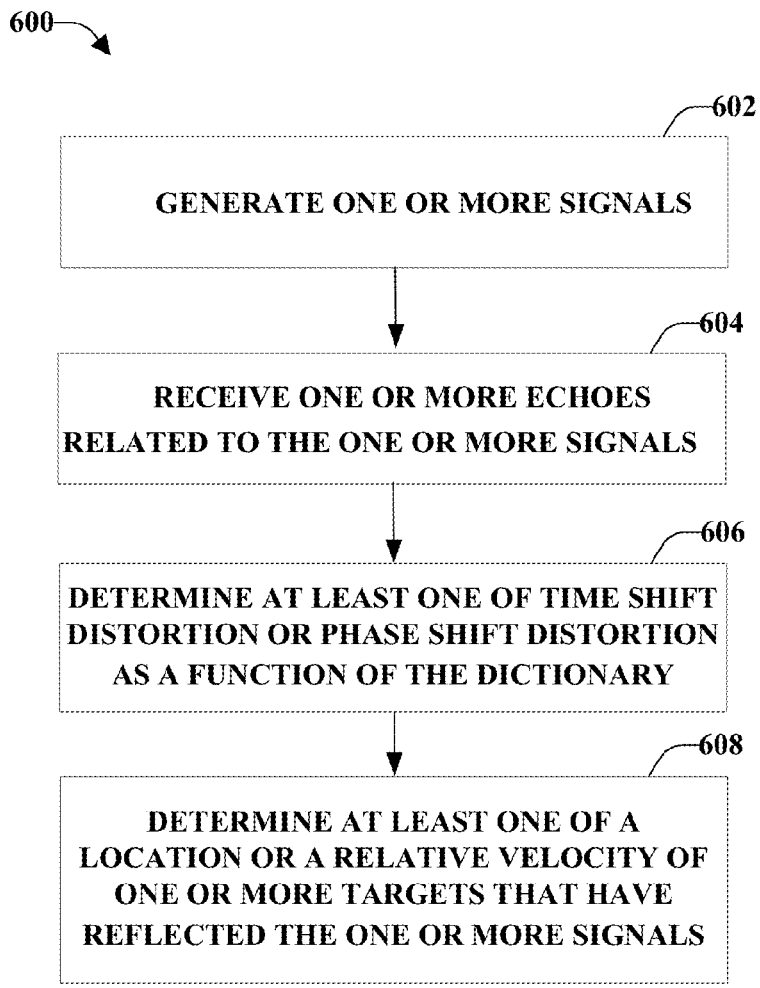
FIG. 6 illustrates a flow diagram of a method for determining distortion in accordance with an embodiment.

Referring now to FIG. 6, there illustrated is an exemplary method 600 to generate a dictionary for signal processing. In an aspect, method 600 can generate the dictionary via one or more systems (e.g., system 100, 200, 300, 400, etc.). It is noted that efficiency(ies) of method 600 results from using various aspects of this disclosure.

At 602, a system can generate one or more signals. In an aspect, a system can generate a signal and communicate the signal through a medium (e.g., free space, cable, airways, etc.). It is noted that signals can be associated with an atom of a dictionary. In another aspect, a device can utilize an atom to generate the one or more signals.

At 604, a system can receive one or more echoes related to the one or more signals. As an example, a signal can bounce off (e.g., reflect) a target (e.g., a vehicle, aircraft, object, etc.), as the signal reflects, an echo can be generate. In an aspect, a single signal can bounce off one or more objects at various relative locations and/or at various relative velocities.

At 606, a system can determine at least one of time shift distortion or phase shift distortion as a function of the dictionary. In an implementation, a system can determine distortion of an echo based on atoms of the dictionary. For example, coefficients can be extracted from a digitized signal. A vector of coefficients can be formed and processed, as disclosed herein.

At 608, a system can determine at least one of a location or a relative velocity of one or more targets that have reflected the one or more signals. In an aspect, the system can determine whether condition (3) (above) is satisfied. When the condition (3) is satisfied, the system can perform optimization to determine distortion, location, and velocity of a target.

Figure 7:
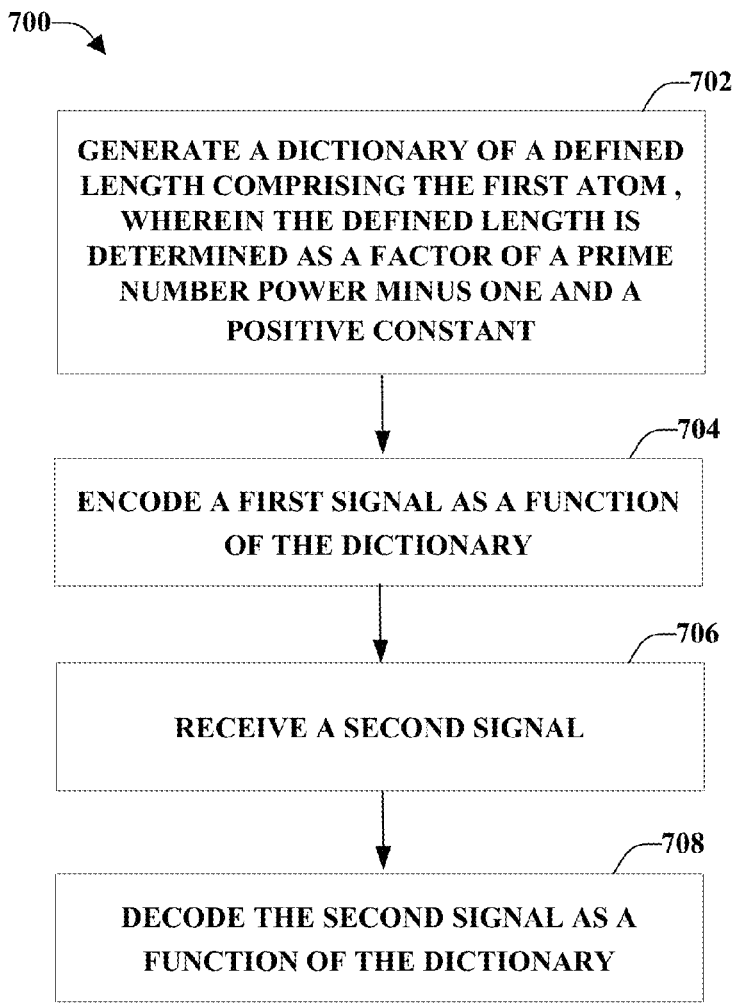
FIG. 7 illustrates a flow diagram of a method for generating encoding and decoding signals in accordance with an embodiment.

Turning now to FIG. 7, there illustrated is an exemplary method 700 to generate a dictionary for signal processing. In an aspect, method 700 can generate the dictionary via one or more systems (e.g., system 100, 200, 300, 400, etc.). It is noted that efficiency(ies) of method 700 results from using various aspects of this disclosure.

At 702, a system can generate a dictionary of a defined length comprising the first atom, wherein the defined length is determined as a factor of a prime number power minus one and a positive constant. In an implementation, a system can generate an $$\left(n, M_s, \frac{c_s}{\sqrt{n}}\right)$$

dictionary comprising the first atom, wherein n is a length of the dictionary and is a factor of a prime power minus one, s is a positive integer, and $c_s$ is an explicit positive constant. It is noted that the system can utilize various aspects disclosed herein to generate the dictionary. In another aspect, the dictionary can be generated as a function of alphabet size, a number of atoms, and the like.

At 704, a system can encode a first signal as a function of the dictionary. In an aspect, the system can modulate the signal onto an atom, such as an atom assigned to a specific transmitter. As an example, a signal can be amplitude modulated by creating a vector. The vector can comprise products of an atom multiplied at each time by a value of a signal. In another aspect, a system can encode multiple signals by modulating respective atoms on to respective signals. It is noted that the encoded signal can be transmitted (e.g., a digital signal is transformed into an analogue radio signal that has an amplitude corresponding to a value of the encoded signal at times corresponding to each element of the vector).

At 706, a system receives a second signal. In an aspect, receiving the signal can comprise generating a set of atoms, digitizing a signal, and the like. In an aspect, a receiving device (e.g., antenna) can receive the signal.

At 708, a system can decode the second signal as a function of the dictionary. For example, a vector is assigned values corresponding to an amplitude of a received signal at a given time. A sparse representation can be determined in terms of atoms of a dictionary.

Figure 8:
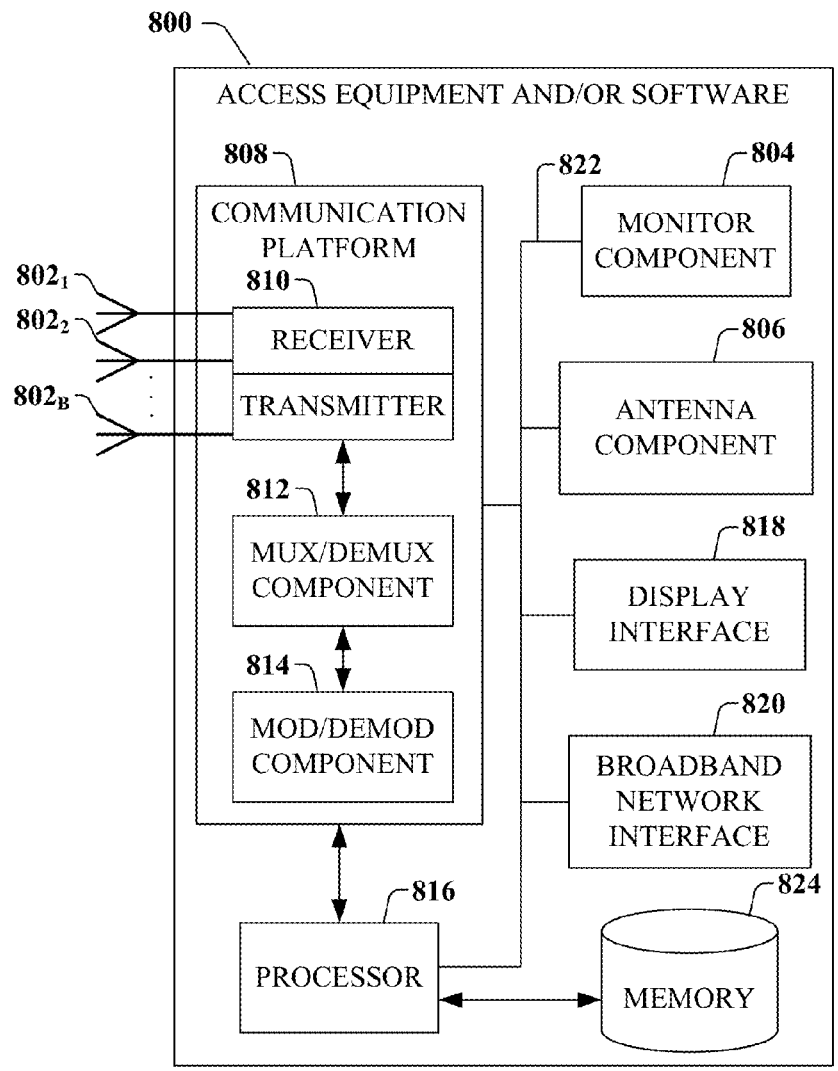
FIG. 8 illustrates a block diagram of access equipment and/or software related to access of a communications network, in accordance with an embodiment.

To provide further context for various aspects of the disclosed subject matter, FIG. 8 illustrates a block diagram of an embodiment of access equipment and/or software 800 related to access of a network (e.g., base station, wireless access point, femtocell access point, and so forth) that can enable and/or exploit features or aspects of the disclosed aspects.

Access equipment and/or software 800 related to access of a network can receive and transmit signal(s) from and to wireless devices, wireless ports, wireless routers, etc. through segments $802_1$-$802_B$ (B is a positive integer). Segments $802_1$-$802_B$ can be internal and/or external to access equipment and/or software 800 related to access of a network, and can be controlled by a monitor component 804 and an antenna component 806. Monitor component 804 and antenna component 806 can couple to communication platform 808, which can include electronic components and associated circuitry that provide for processing and manipulation of received signal(s) and other signal(s) to be transmitted.

In an aspect, communication platform 808 includes a receiver/transmitter 910 that can convert analog signals to digital signals upon reception of the analog signals, and can convert digital signals to analog signals upon transmission. In addition, receiver/transmitter 810 can divide a single data stream into multiple, parallel data streams, or perform the reciprocal operation. Coupled to receiver/transmitter 810 can be a multiplexer/demultiplexer 812 that can facilitate manipulation of signals in time and frequency space. Multiplexer/demultiplexer 812 can multiplex information (data/traffic and control/signaling) according to various multiplexing schemes such as time division multiplexing, frequency division multiplexing, orthogonal frequency division multiplexing, code division multiplexing, space division multiplexing. In addition, multiplexer/demultiplexer component 812 can scramble and spread information (e.g., codes, according to substantially any code known in the art, such as Hadamard-Walsh codes, Baker codes, Kasami codes, polyphase codes, and so forth).

A modulator/demodulator 814 is also a part of communication platform 908, and can modulate information according to multiple modulation techniques, such as frequency modulation, amplitude modulation (e.g., M-ary quadrature amplitude modulation, with M a positive integer); phase-shift keying; and so forth).

Access equipment and/or software 800 related to access of a network also includes a processor 816 configured to confer, at least in part, functionality to substantially any electronic component in access equipment and/or software 800. In particular, processor 816 can facilitate configuration of access equipment and/or software 800 through, for example, monitor component 804, antenna component 806, and one or more components therein. Additionally, access equipment and/or software 800 can include display interface 818, which can display functions that control functionality of access equipment and/or software 800, or reveal operation conditions thereof. In addition, display interface 818 can include a screen to convey information to an end user. In an aspect, display interface 818 can be a liquid crystal display, a plasma panel, a monolithic thin-film based electrochromic display, and so on. Moreover, display interface 818 can include a component (e.g., speaker) that facilitates communication of aural indicia, which can also be employed in connection with messages that convey operational instructions to an end user. Display interface 818 can also facilitate data entry (e.g., through a linked keypad or through touch gestures), which can cause access equipment and/or software 800 to receive external commands (e.g., restart operation).

Broadband network interface 820 facilitates connection of access equipment and/or software 800 to a service provider network (not shown) that can include one or more cellular technologies (e.g., third generation partnership project universal mobile telecommunication system, global system for mobile communication, and so on) through backhaul link(s) (not shown), which enable incoming and outgoing data flow. Broadband network interface 820 can be internal or external to access equipment and/or software 800, and can utilize display interface 818 for end-user interaction and status information delivery.

Processor 816 can be functionally connected to communication platform 908 and can facilitate operations on data (e.g., symbols, bits, or chips) for multiplexing/demultiplexing, such as effecting direct and inverse fast Fourier transforms, selection of modulation rates, selection of data packet formats, inter-packet times, and so on. Moreover, processor 816 can be functionally connected, through data, system, or an address bus 822, to display interface 818 and broadband network interface 820, to confer, at least in part, functionality to each of such components.

In access equipment and/or software 800, memory 824 can retain location and/or coverage area (e.g., macro sector, identifier(s)), access list(s) that authorize access to wireless coverage through access equipment and/or software 800, sector intelligence that can include ranking of coverage areas in the wireless environment of access equipment and/or software 800, radio link quality and strength associated therewith, or the like. Memory 824 also can store data structures, code instructions and program modules, system or device information, code sequences for scrambling, spreading and pilot transmission, access point configuration, and so on. Processor 816 can be coupled (e.g., through a memory bus), to memory 824 in order to store and retrieve information used to operate and/or confer functionality to the components, platform, and interface that reside within access equipment and/or software 800.

As it employed in the subject specification, the term "processor" can refer to substantially any computing processing unit or device including, but not limited to including, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit, a digital signal processor, a field programmable gate array, a programmable logic controller, a complex programmable logic device, a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," "data storage," "database," and substantially any other information storage component relevant to operation and functionality of a component and/or process, refer to "memory components," or entities embodied in a "memory," or components including the memory. It is noted that the memory components described herein can be either volatile memory or nonvolatile memory, or can include both volatile and nonvolatile memory.

By way of illustration, and not limitation, nonvolatile memory, for example, can be included in memory 824, non-volatile memory (see below), disk storage (see below), and memory storage (see below). Further, nonvolatile memory can be included in read only memory, programmable read only memory, electrically programmable read only memory, electrically erasable programmable read only memory, or flash memory. Volatile memory can include random access memory, which acts as external cache memory. By way of illustration and not limitation, random access memory is available in many forms such as synchronous random access memory, dynamic random access memory, synchronous dynamic random access memory, double data rate synchronous dynamic random access memory, enhanced synchronous dynamic random access memory, Synchlink dynamic random access memory, and direct Rambus random access memory. Additionally, the disclosed memory components of systems or methods herein are intended to include, without being limited to including, these and any other suitable types of memory.

Figure 9:
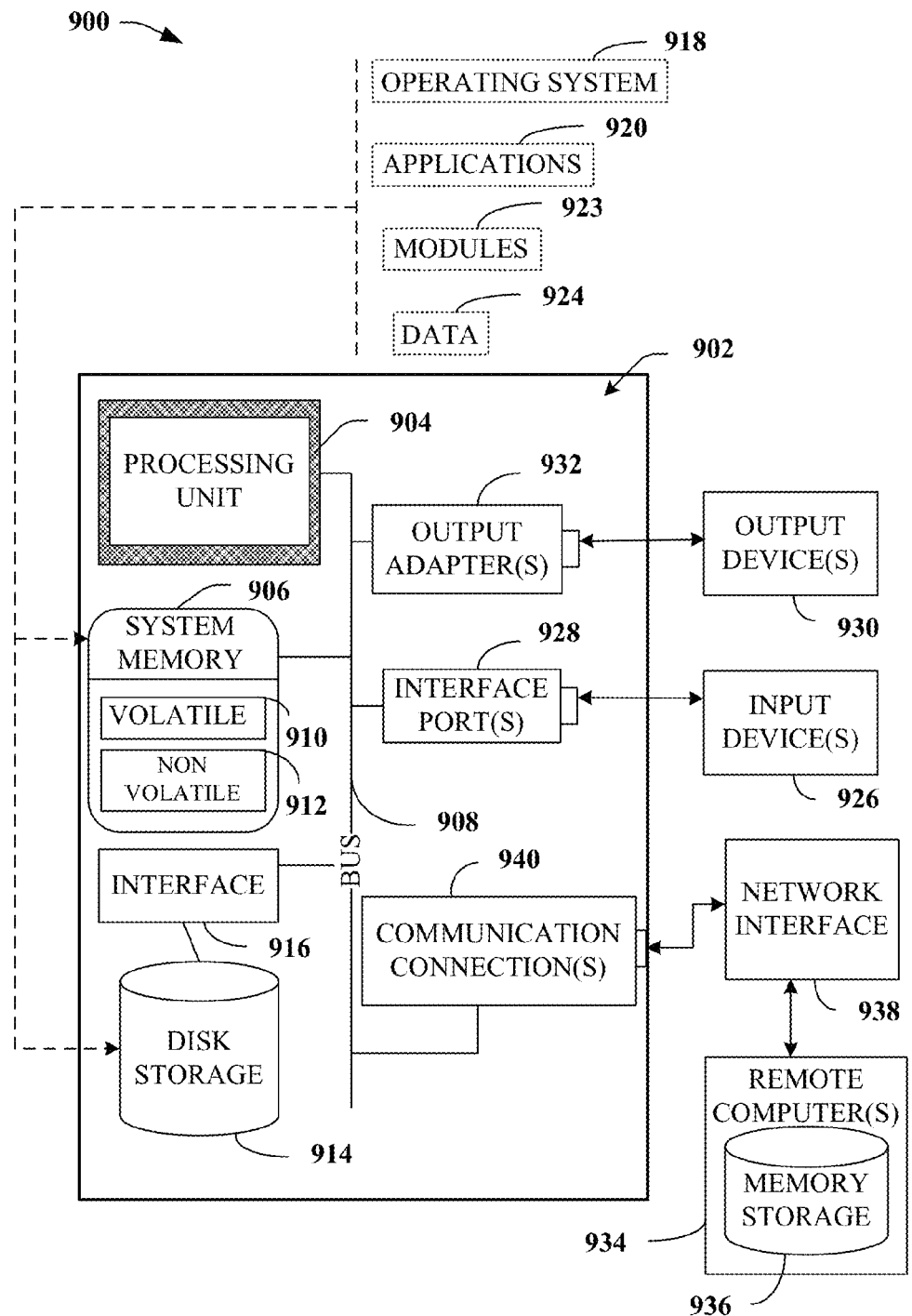
FIG. 9 illustrates a block diagram of a computing system, in accordance with an embodiment.

In order to provide a context for the various aspects of the disclosed subject matter, FIG. 9, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the various aspects also can be implemented in combination with other program modules. Generally, program modules include routines, programs, components, data structures, etc. that performs particular tasks and/or implement particular abstract data types. For example, in memory (such as memory 404) there can be software, which can instruct a processor (such as processor 406) to perform various actions. The processor can be configured to execute the instructions in order to implement the analysis of determining assignments for data streams transmitted to one or more devices, suppressing inter-cell interference, and/or suppressing intra-cell interference.

Moreover, those skilled in the art will understand that the various aspects can be practiced with other computer system configurations, including single-processor or multiprocessor computer systems, mini-computing devices, mainframe computers, as well as personal computers, base stations, handheld computing devices or user equipment, such as a tablet, phone, watch, and so forth, processor-based computers/systems, microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

With reference to FIG. 9, a block diagram of a computing system 900 operable to execute the disclosed systems and methods is illustrated, in accordance with an embodiment. Computer 902 includes a processing unit 904, a system memory 906, and a system bus 908. System bus 908 couples system components including, but not limited to, system memory 906 to processing unit 904. Processing unit 904 can be any of various available processors. Dual microprocessors and other multiprocessor architectures also can be employed as processing unit 904.

System bus 908 can be any of several types of bus structure(s) including a memory bus or a memory controller, a peripheral bus or an external bus, and/or a local bus using any variety of available bus architectures including, but not limited to, industrial standard architecture, micro-channel architecture, extended industrial standard architecture, intelligent drive electronics, video electronics standards association local bus, peripheral component interconnect, card bus, universal serial bus, advanced graphics port, personal computer memory card international association bus, Firewire (institute of electrical and electronics engineers 1194), and small computer systems interface.

System memory 906 includes volatile memory 910 and nonvolatile memory 912. A basic input/output system, containing routines to transfer information between elements within computer 902, such as during start-up, can be stored in nonvolatile memory 912. By way of illustration, and not limitation, nonvolatile memory 912 can include read only memory, programmable read only memory, electrically programmable read only memory, electrically erasable programmable read only memory, or flash memory. Volatile memory 910 can include random access memory, which acts as external cache memory. By way of illustration and not limitation, random access memory is available in many forms such as dynamic random access memory, synchronous random access memory, synchronous dynamic random access memory, double data rate synchronous dynamic random access memory, enhanced synchronous dynamic random access memory, Synchlink dynamic random access memory, and direct Rambus random access memory, direct Rambus dynamic random access memory, and Rambus dynamic random access memory.

Computer 902 also includes removable/non-removable, volatile/non-volatile computer storage media. In an implementation, provided is a non-transitory or tangible computer-readable medium storing computer-executable instructions that, in response to execution, cause a system comprising a processor to perform operations. The operations can include generating a dictionary of atoms as disclosed herein. The operations can also include interpreting a radar signal, denoiseing a signal, compressing data, deblurring the signal, encoding or decoding signals for at least one of code division multiple access communication or orthogonal frequency-division multiple access communication, classifying a data set, generating a random number, or generating an error correcting code.

In an implementation, determining the assignments can comprise maximizing a sum of a function applied to the data streams. In another implementation, determining the assignments can comprise initializing a stream assignment policy and determining whether interference alignment is applicable to the data streams based on the stream assignment policy.

According to an implementation, the one or more devices of the multiple-input multiple-output network comprise a combination of cells, user devices, and antennas. In some implementations, the one or more devices of the multiple-input multiple-output network comprise a three or more cells. In a further implementation, the operations can include zero forcing the inter-cell interference and the intra-cell interference.

Figure 10:
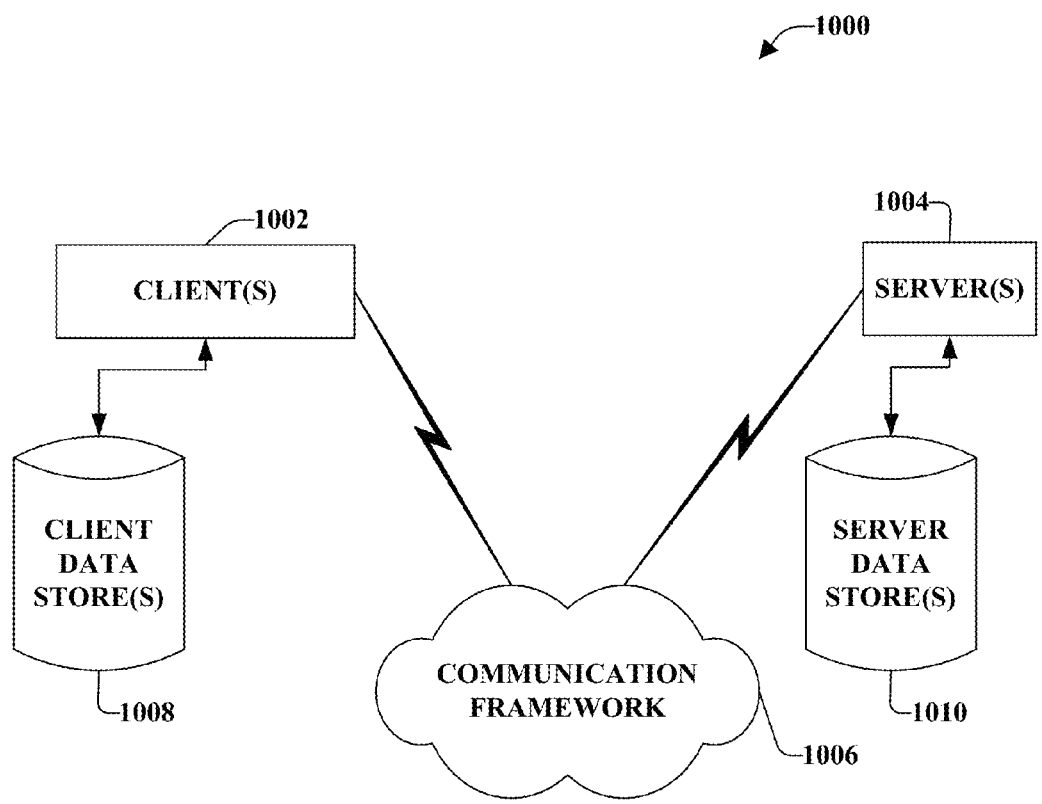
FIG. 10 illustrates a block diagram representing exemplary non-limiting networked environments in which various non-limiting embodiments described herein can be implemented.

FIG. 10 illustrates, for example, disk storage 1014. Disk storage 1014 includes, but is not limited to, devices such as a magnetic disk drive, floppy disk drive, tape drive, Jaz drive, Zip drive, superdisk drive, flash memory card, or memory stick. In addition, disk storage 1014 can include storage media separately or in combination with other storage media including, but not limited to, an optical disk drive such as a compact disk read only memory device, compact disk recordable drive, compact disk rewritable drive or a digital versatile disk read only memory drive. To facilitate connection of the disk storage 1014 to system bus 1008, a removable or non-removable interface can be used, such as interface component 1016.

It is to be noted that FIG. 10 describes software that acts as an intermediary between users and computer resources described in a suitable operating environment. Such software includes an operating system 1018. Operating system 1018, which can be stored on disk storage 1014, acts to control and allocate resources of computer system 1002. System applications 1020 can take advantage of the management of resources by operating system 1018 through program modules 1022 and program data 1024 stored either in system memory 1006 or on disk storage 1014. It is to be understood that the disclosed subject matter can be implemented with various operating systems or combinations of operating systems.

A user can enter commands or information, for example through interface component 1016, into computer system 1002 through input device(s) 1026. Input devices 1026 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to processing unit 1004 through system bus 1008 through interface port(s) 1028. Interface port(s) 1028 include, for example, a serial port, a parallel port, a game port, and a universal serial bus. Output device(s) 1030 use some of the same type of ports as input device(s) 1026.

Thus, for example, a universal serial bus port can be used to provide input to computer 1002 and to output information from computer 1002 to an output device 1030. Output adapter 1032 is provided to illustrate that there are some output devices 1030, such as monitors, speakers, and printers, among other output devices 1030, which use special adapters. Output adapters 1032 include, by way of illustration and not limitation, video and sound cards that provide means of connection between output device 1030 and system bus 1008. It is also noted that other devices and/or systems of devices provide both input and output capabilities such as remote computer(s) 1034.

Computer 1002 can operate in a networked environment using logical connections to one or more remote computers, such as remote computer(s) 1034. Remote computer(s) 1034 can be a personal computer, a server, a router, a network computer, a workstation, a microprocessor based appliance, a peer device, or other common network node and the like, and can include many or all of the elements described relative to computer 1002.

For purposes of brevity, only one memory storage device 1036 is illustrated with remote computer(s) 1034. Remote computer(s) 1034 is logically connected to computer 1002 through a network interface 1038 and then physically connected through communication connection 1040. Network interface 1038 encompasses wire and/or wireless communication networks such as local area networks and wide area networks. Local area network technologies include fiber distributed data interface, copper distributed data interface, Ethernet, token ring and the like. Wide area network technologies include, but are not limited to, point-to-point links, circuit switching networks such as integrated services digital networks and variations thereon, packet switching networks, and digital subscriber lines.

Communication connection(s) 1040 refer(s) to hardware/software employed to connect network interface 1038 to system bus 1008. While communication connection 1040 is shown for illustrative clarity inside computer 1002, it can also be external to computer 1002. The hardware/software for connection to network interface 1038 can include, for example, internal and external technologies such as modems, including regular telephone grade modems, cable modems and DSL modems, ISDN adapters, and Ethernet cards.

Referring now to FIG. 10, there is illustrated a schematic block diagram of a computing environment 1000 in accordance with this specification. The system 1000 includes one or more client(s) 1002 (e.g., laptops, smart phones, PDAs, media players, computers, portable electronic devices, tablets, and the like). The client(s) 1002 can be hardware and/or software (e.g., threads, processes, computing devices). The system 1000 also includes one or more server(s) 1004. The server(s) 1404 can also be hardware or hardware in combination with software (e.g., threads, processes, computing devices). The servers 1404 can house threads to perform transformations by employing aspects of this disclosure, for example. One possible communication between a client 1002 and a server 1004 can be in the form of a data packet transmitted between two or more computer processes wherein the data packet may include video data. The data packet can include a cookie and/or associated contextual information, for example. The system 1000 includes a communication framework 1006 (e.g., a global communication network such as the Internet, or mobile network(s)) that can be employed to facilitate communications between the client(s) 1002 and the server(s) 1004.

Communications can be facilitated via a wired (including optical fiber) and/or wireless technology. The client(s) 1002 are operatively connected to one or more client data store(s) 1008 that can be employed to store information local to the client(s) 1002 (e.g., cookie(s) and/or associated contextual information). Similarly, the server(s) 1004 are operatively connected to one or more server data store(s) 1010 that can be employed to store information local to the servers 1004.

In one embodiment, a client 1002 can transfer an encoded file, in accordance with the disclosed subject matter, to server 1004. Server 1004 can store the file, decode the file, or transmit the file to another client 1002. It is noted, that a client 1002 can also transfer uncompressed file to a server 1004 and server 1004 can compress the file in accordance with the disclosed subject matter. Likewise, server 1004 can encode information and transmit the information via communication framework 1006 to one or more clients 1002.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the s and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2300, etc. UTRA includes Wideband-CDMA (W-CDMA) and other variants of CDMA. Further, CDMA2300 covers IS-2300, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.23, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC- FDMA on uplink. UTRA, E-UTRA, UMTS, LTE and GSM are described in documents from an organization named "3rd Generation Partnership Project" (3GPP). Additionally, CDMA2300 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical disks (e.g., compact disk (CD), digital versatile disk (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction, and/or data. Additionally, a computer program product may include a computer readable medium having one or more instructions or codes operable to cause a computer to perform functions described herein.

Further, the actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the steps and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments

What is claimed is:

1. A system, comprising:
a processor, communicatively coupled to a memory, that executes or facilitates execution of computer executable components stored in a computer readable storage medium, the computer executable components comprising:
a dictionary component configured to at least:
determine a representation of a finite index set, associated with a defined alphabet size, that comprises at least one vector of integers having a positive integer number of dimensions;
determine a first atom for a device, wherein the first atom is a unit-vector of the representation and is of a defined vector length; and
generate dictionary data representing a dictionary of a defined dictionary length and comprising the first atom, wherein:
the defined dictionary length is determined as a factor of a prime number power minus one and a first constant value,
a normalized peak-to-average power ratio is less than an inverse of a square root of the defined vector length multiplied by a second constant value, and
an autocorrelation and cross correlation under frequency modulation and time translation is less than the inverse of the square root of the defined vector length multiplied by a third constant value.

2. The system of claim 1, wherein the dictionary component is further configured to determine the positive integer number of dimensions as a function of the defined dictionary length, the second constant value and the third constant value depend on the defined dictionary length, and the defined vector length and the defined alphabet size increase linearly as a value of a log of the defined dictionary length, divided by the defined vector length, increases.

3. The system of claim 1, further comprising selecting at least one of the positive integer number of dimensions, the defined dictionary length, and the first constant as a function of the defined alphabet size of the dictionary.

4. The system of claim 1, wherein the dictionary component is further configured to determine the first constant as a function of the positive integer number of dimensions.

5. The system of claim 1, wherein the dictionary component is further configured to at least one of encode or decode a signal as a function of the dictionary data.

6. The system of claim 1, wherein the dictionary component is further configured to determine a representation of a signal as a function of the dictionary data and a threshold amount of non-zero coefficients.

7. The system of claim 1, wherein the dictionary component is further configured to determine a Fourier transform of the dictionary data representing the dictionary resulting in transform dictionary data representing a transform dictionary of the defined dictionary length.

8. The system of claim 1, wherein the dictionary component is further configured to determine a second atom for a second device, wherein the second atom is different from the first atom.

9. The system of claim 8, wherein the dictionary component is further configured to generate the dictionary data comprising at least the first atom and the second atom.

10. The system of claim 1, wherein the dictionary component is further configured to at least one of interpret a radar signal, denoise a signal, compress data, deblur the signal, encode or decode the signal for at least one of code division multiple access communication or orthogonal frequency-division multiple access communication, classify a data set, generate a random number, or generate an error correction code.

11. The system of claim 1, wherein the first atom is determined using a normalized ratio from the normalized peak-to-average power ratio.

12. A method, comprising:
    determining, by a system comprising a processor, a representation of a finite index set, associated with a defined alphabet size, that comprises at least one vector of integers having a positive integer number of dimensions;
    determining a first atom for a device wherein the first atom is a vector of the representation and of a defined vector length; and
    generating dictionary data representing a dictionary of a defined dictionary length that comprises the first atom, wherein:
        the defined dictionary length is determined as a factor of a prime number power minus one and a first constant number,
        a normalized peak-to-average power ratio is less than an inverse of a square root of the defined vector length multiplied by a second constant number, and
        an autocorrelation and cross correlation under frequency modulation and time translation is less than the inverse of the square root of the defined vector length multiplied by a third constant number.

13. The method of claim 12, further comprising determining a set of roots of unity of the finite index set as a function of an additive function.

14. The method of claim 13, further comprising determining the defined alphabet length of the dictionary represented by the dictionary data as a function of the set of roots of unity, and wherein the second constant number and the third constant number depend on the defined dictionary length, and the defined vector length and the defined alphabet size increase linearly as a value of a log of the defined dictionary length, divided by the defined vector length, increases.

15. The method of claim 12, wherein the determining the first atom for the device further comprises assigning the first atom to the device based on a criterion that the first atom be unique from other atoms of the dictionary represented by the dictionary data.

16. The method of claim 12, further comprising determining a representation, in terms of at least one atom, including the first atom, represented by the dictionary data, of at least one signal as a function of a threshold amount of non-zero coefficients.

17. The method of claim 12, further comprising:
    generating one or more signals;
    receiving one or more echoes related to the one or more signals; and
    determining at least one of time shift distortion or phase shift distortion of the one or more signals as a function of the dictionary.

18. The method of claim 17, further comprising determining at least one of a location or a relative velocity of one or more targets that have reflected the one or more signals.

19. The method of claim 17, further comprising determining one or more bits of the one or more echoes as a function of the dictionary and at least one of the time shift distortion or the phase shift distortion.

20. A system, comprising:
    means for determining a representation of a finite index set, associated with a defined alphabet size, that comprises at least one vector of integers having a positive integer number of dimensions;
    means for determining an atom, having a defined vector length, for a device, wherein the atom is a vector of the representation; and
    means for generating dictionary data representing a dictionary of a defined dictionary length comprising the atom, wherein:
        the defined dictionary length is determined as a factor of a prime number power minus one and a constant value,
        a normalized peak-to-average power ratio is less than an inverse of a square root of the defined vector length multiplied by a second constant number,
        an autocorrelation and cross correlation under frequency modulation and time translation is less than the inverse of the square root of the defined vector length multiplied by a third constant number,
        the second constant number and the third constant number depend on the defined dictionary length, and
        the defined vector length and the defined alphabet size increase linearly as a value of a log of the defined dictionary length, divided by the defined vector length, increases.

21. The system of claim 20, wherein the means for generating the dictionary data comprises means for determining at least one of time shift distortion or means for phase shift distortion of a received signal.

22. The system of claim 20, further comprising means for determining a representation of a signal as a function of the dictionary data and a target amount of non-zero coefficients.

23. The system of claim 20, wherein the means for determining the atom comprises means for generating the atom as a function of the defined dictionary length and a time associated with the atom.

24. A non-transitory computer-readable storage medium comprising computer-executable instructions that, in response to execution, cause a device comprising a processor to perform operations, comprising:
    determining, by a system, a representation of a finite index set, associated with a determined alphabet size, that comprises at least one vector of integers having a defined positive integer number of dimensions;
    determining an atom for a device wherein the atom is a vector of the representation and of a defined vector length; and
    generating dictionary data representing a dictionary of a defined dictionary length comprising the atom, wherein:
        the defined dictionary length is determined as a factor of a prime number power minus one and a first constant number,
        a normalized peak-to-average power ratio is less than an inverse of a square root of the defined vector length multiplied by a second constant number, and
        an autocorrelation and cross correlation under frequency modulation and time translation is less than the inverse of the square root of the defined vector length multiplied by a third constant number.

25. The non-transitory computer-readable storage medium of claim 24, wherein the generating the dictionary data further comprises determining a cardinality of the dictionary represented by the dictionary data as a function of the defined dictionary length, the second constant number and the third constant number depend on the defined dictionary length, and the defined vector length and the defined alphabet size increase linearly as a value of a log of the defined dictionary length, divided by the defined vector length, increases.

26. The non-transitory computer-readable storage medium of claim 24, wherein the operations further comprise at least one of encoding or decoding a signal as a function of the dictionary represented by the dictionary data.

27. The non-transitory computer-readable storage medium of claim 24, wherein the operations further comprise determining a bit of a signal as a function of the dictionary represented by the dictionary data.

* * * * *